(12) United States Patent
Doumae et al.

(10) Patent No.: US 8,477,465 B2
(45) Date of Patent: Jul. 2, 2013

(54) EARTH LEAKAGE DETECTION METHOD

(75) Inventors: Hiroshi Doumae, Osaka (JP); Hitoshi Hashimoto, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 680 days.

(21) Appl. No.: 12/740,602

(22) PCT Filed: Sep. 9, 2008

(86) PCT No.: PCT/JP2008/066228
§ 371 (c)(1),
(2), (4) Date: Apr. 29, 2010

(87) PCT Pub. No.: WO2009/057387
PCT Pub. Date: May 7, 2009

(65) Prior Publication Data
US 2010/0296206 A1    Nov. 25, 2010

(30) Foreign Application Priority Data

Oct. 30, 2007  (JP) ................................. 2007-281146

(51) Int. Cl.
*H02H 3/00*   (2006.01)
*H02H 7/00*   (2006.01)

(52) U.S. Cl.
USPC ............................................ 361/42; 361/22

(58) Field of Classification Search
USPC .................................................... 361/22, 42
See application file for complete search history.

(56) References Cited

U.S. PATENT DOCUMENTS

| 4,027,202 A * | 5/1977 | Tyler et al. ....................... 361/33 |
| 5,784,232 A * | 7/1998 | Farr ................................. 361/22 |
| 2010/0296206 A1* | 11/2010 | Doumae et al. .................. 361/42 |

FOREIGN PATENT DOCUMENTS

| JP | 61-291881 A | 12/1986 |
| JP | 63-89550 U | 6/1988 |
| JP | 2-214412 A | 8/1990 |
| JP | 2-294217 A | 12/1990 |
| JP | 4-39558 A | 2/1992 |
| JP | 6-257906 A | 9/1994 |
| JP | 8-4680 A | 1/1996 |

* cited by examiner

*Primary Examiner* — Ronald W Leja
(74) *Attorney, Agent, or Firm* — Birch, Stewart, Kolasch & Birch, LLP

(57) ABSTRACT

It is judged whether the abnormal current is due to the electric leakage or not by a detection step detecting the abnormal current by the leakage current detection board and comparing a threshold value of predetermined items stored in a storing unit and actual values corresponding to the items at the time of when a compressor is stopped by detecting the abnormal current in the detection step. Specifically, the abnormal current is recognized as the electric leakage to be displayed on a display unit when at least one of the operating time at the time of detecting the abnormal current, the inner pressure of a motor, and a discharge pipe temperature is lower than the corresponding threshold value.

20 Claims, 3 Drawing Sheets

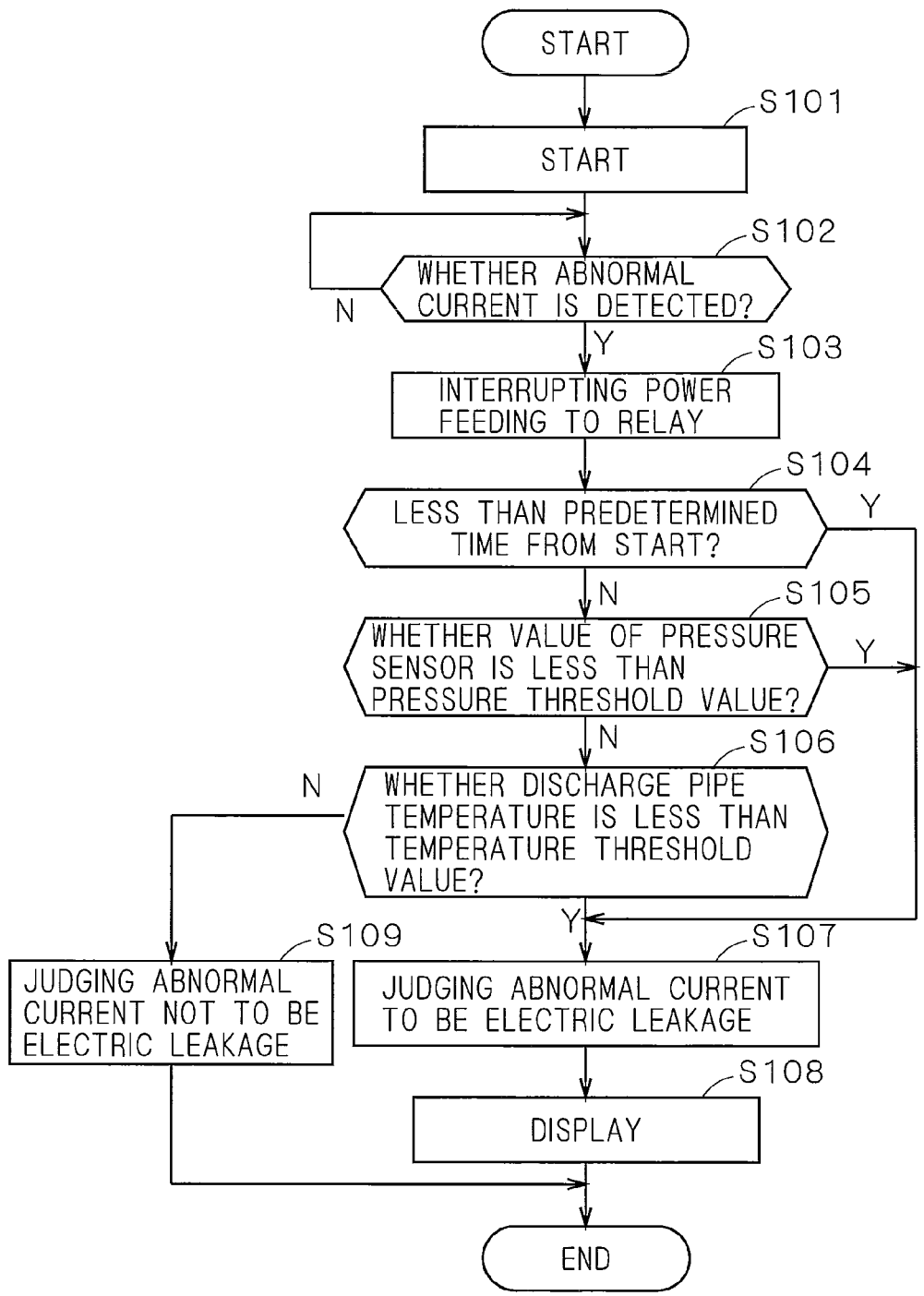

EARTH LEAKAGE DETECTION METHOD

TECHNICAL FIELD

The present invention relates to a recognition method of electric leakage detection, and particularly relates to a recognition method of electric leakage detection when an electric leakage detection function is retrofitted to an existing compressor.

BACKGROUND ART

Conventionally, a technique having an electric leakage detection function has been proposed in an electric water heater with a pressure switch, as disclosed Japanese Utility Model Application No. 63-089550, for example.

DISCLOSURE OF INVENTION

Problems to be Solved by the Invention

These and other objects, features, aspects and advantages of the present invention will become more apparent from the following detailed description of the present invention when taken in conjunction with the accompanying drawings.

In the technology disclosed in Japanese Utility Model Application No. 63-089550, when leakage current is detected, a pressure switch serves as a source of an operation signal generating a pseudo-current equivalent to a current at the time of a pressure detection operation to an electric leakage circuit breaker to keep a non-conducting state to a heater circuit.

However, in the technology disclosed in Japanese Utility Model Application No. 63-089550, when the electric leakage detection function is retrofitted to an existing compressor with a pressure switch and the like, there have been problems described in the following. That is, (1) when electric leakage is detected, it is difficult to directly control conduction/non-conduction of an electromagnetic contactor provide in the compressor; (2) in the case where at least a part of the electric leakage detection function is shared as a part of an existing control circuit, when the electromagnetic contactor is put into a non-conducting state by detecting any abnormalities, the cause of which is not determined whether it is due to the electric leakage or it is due to the operation of the pressure switch, so that it is inconvenient in dealing with; (3) in relation with the above (2), it is not determined whether the electric leakage detection is performed or not.

In view of the above problems, an object of the present invention is to provide a recognition method of electric leakage detection when an electric leakage detection function is retrofitted to an existing compressor.

Means for Solving the Problems

In order to solve the above problems, according to a first aspect of the present invention, an electric leakage detection method in a power supply system including: an electrical circuit (104); an opening and closing means (106) switching conduction (opening)/non-conduction (closing) of the electrical circuit; an electric power load (150) connected to the electrical circuit through the opening and closing means; an operation abnormality detecting means (108) detecting operation abnormality of the electric power load; an abnormal current detecting means (110) detecting abnormal current; and a controlling means (112) controlling the opening and closing means, the electric leakage detection method comprising the steps of: (a) judging whether the abnormal current is detected or not in the electrical circuit (S102); (b) judging whether the electric power load is operation abnormality or not when the judgment in the step (a) is positive (S103 to S105); (c) judging that the electric leakage is generated in the electrical circuit when the judgment in the step (b) is negative (S106); and (d) judging that the electric leakage is not generated in the electrical circuit when the judgment in the step (b) is positive (S107).

According to a second aspect of the present invention, in the first aspect, the power supply system further includes: a power source (102); a relay means (114) operating the opening and closing means (106); and a first protection switch (116) and a second protection switch (118) connected in series between the power source and the relay means, the opening and closing means enters into a conducting state when power is supplied to the relay means, the opening and closing means enters into a non-conducting state when power is not supplied to the relay means, the first protection switch enters into a non-conducting state when the judgment in the step (b) is positive, and the second protection switch enters into a non-conducting state when the judgment in the step (b) is negative.

According to a third aspect of the present invention, in the second aspect, the power supply system further includes: a storing means (120) storing threshold values (122, 126, 130) of items previously determined; and a measuring means (124, 128, 132) measuring actual values of the items stored in the storing means, and in the step (b), the electric power load (150) is judged whether it is operation abnormality or not by comparing the threshold values and the actual values.

According to a fourth aspect of the present invention, in the third aspect, the power supply system is applied to a compressor (100), and in the step (b), the electric power load (150) is judged whether it is operation abnormality or not by comparing inner pressure of the compressor calculated on the basis of the actual values measured by the measuring means (124, 128, 132) and the threshold values (122, 126, 130) stored in the storing means (120).

According to a fifth aspect of the present invention, in the fourth aspect, the measuring means (124) measures operating time from starting of the compressor, the storing means (120) stores a time threshold value (122) previously determined, and in the step (b), when time while detecting the abnormal current is shorter than the time threshold value (122), the judgment is negative.

According to a sixth aspect of the present invention, in the fourth or fifth aspect, the measuring means (128) measures the inner pressure of the compressor, the storing means (120) stores a pressure threshold value (126) previously determined in accordance with the operating time from starting, and in the step (b), when the inner pressure at the time of detecting the abnormal current is lower than the pressure threshold value, the judgment is negative.

According to a seventh aspect of the present invention, in any of the fourth to sixth aspects, the measuring means (132) measures temperature of a discharge pipe provided in the compressor, the storing means (120) stores a temperature threshold value (130) of the discharge pipe previously determined in accordance with the operating time from starting, and in the step (b), when the temperature at the time of detecting the abnormal current is lower than the temperature threshold value (130), the judgment is negative.

According to a eighth aspect of the present invention, in any of the first to seventh aspects, the power supply system further includes a display means (134), and the electric leakage detection method further includes a step of (e) displaying the judgment results of the steps (c) and (d) on the display means (S107).

Effects of the Invention

When the abnormal current is detected, the cause thereof is assumed to be operation abnormality of electric power load other than the electric leakage. According to the first aspect of the present invention, whether the electric leakage is generated or not is judged on the basis of the presence or absence of the operation abnormality of the electric power load. In addition, the step (a) itself is performed by employing a means usually provided in an electric circuit. Accordingly, it is unnecessary to newly provide a means for performing the steps (a) and (b), conducting a leakage current detecting method.

The second aspect of the invention is achieved only by connecting the second protection switch in series between the relay means and the first protection switch since the relay means and the first protection switch have been usually provided from before.

According to the third aspect of the invention, whether the electric power load is operation abnormality or not is accurately judged.

According to the fourth aspect of the invention, whether the electric power load is operation abnormality or not is accurately judged when the power supply system is applied to the compressor.

The current is usually consumed in the compressor for an initial operation and for pressurizing inside the compressor while a predetermined time has passed from starting. Focusing on this point, according to the fifth aspect of the invention, the electric leakage is accurately recognized, dealing with the electric leakage immediately. A timer measuring the operating time from starting may be mounted on the existing compressor so that it may be achieved without providing a new means.

The current is usually consumed in the compressor for an initial operation and for pressurizing inside the compressor while a predetermined time has passed from starting. Focusing on this point, according to the sixth aspect of the invention, the electric leakage is accurately recognized, dealing with the electric leakage immediately. A pressure sensor measuring inner pressure of the compressor and the pressure threshold value may be mounted on the existing compressor so that they may be achieved without providing a new means.

The current is usually consumed in the compressor for an initial operation and for pressurizing inside the compressor while a predetermined time has passed from starting. Focusing on this point, according to the seventh aspect of the invention, the electric leakage is accurately recognized, dealing with the electric leakage immediately. A discharge pipe thermometer measuring temperature of the discharge pipe and the temperature threshold value may be mounted on the existing compressor so that they may be achieved without providing a new means.

According to the eight aspect of the invention, the operation of the electric leakage detection is clearly recognized.

BRIEF DESCRIPTION OF DRAWINGS

FIG. 3 is a flow chart showing a recognition method of the electric leakage detection.

BEST MODE FOR CARRYING OUT THE INVENTION

Figure 1:
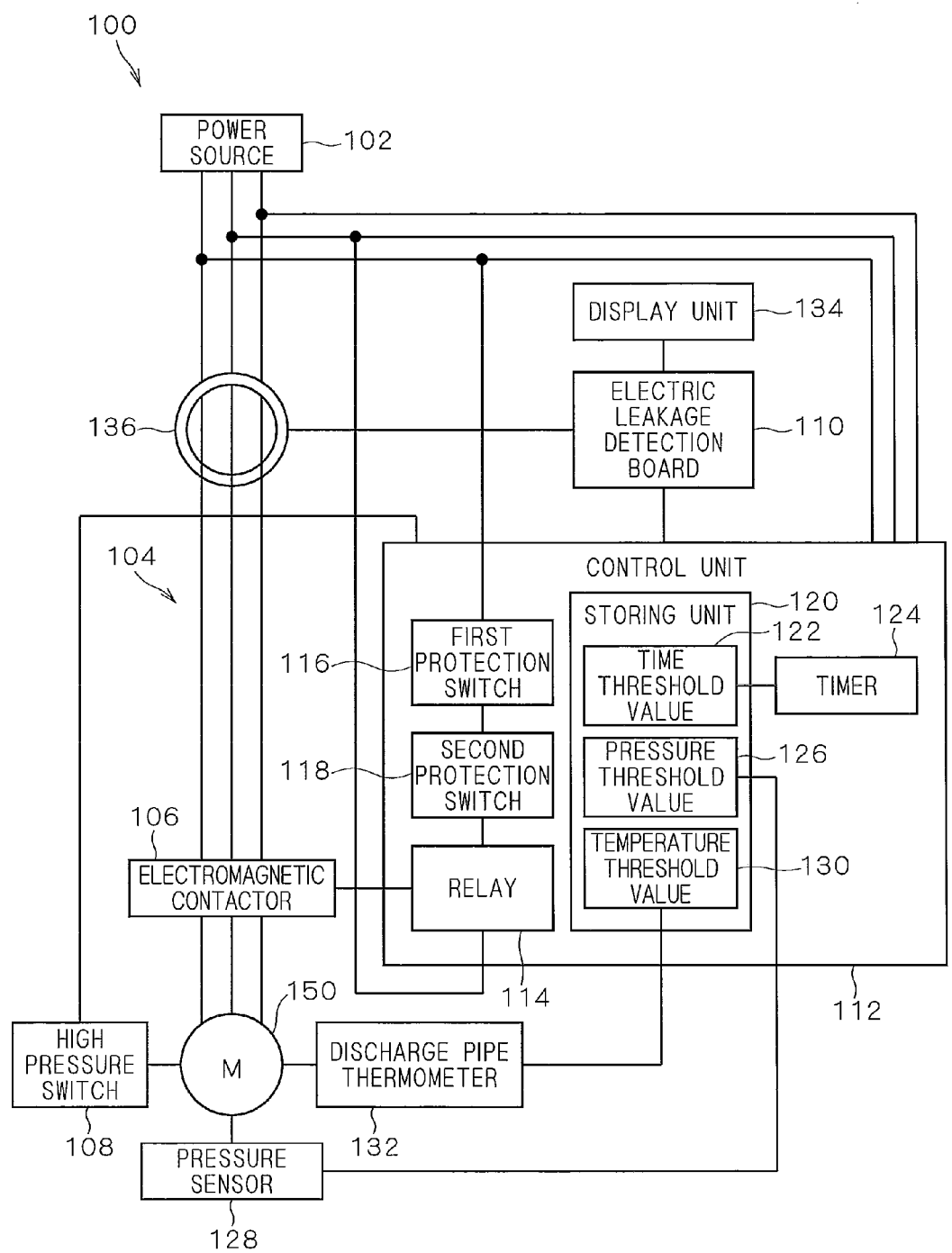
FIG. 1 is a block diagram illustrating an electric leakage detection function according to a preferred embodiment of the present invention.

Hereinafter, a preferred embodiment of the present invention will be described referring to the drawings. In the drawings including FIG. 1 and other Figures, elements only related to the present invention will be shown.

<General Configuration>

FIG. 1 is a schematic diagram showing a power supply system accomplishing a recognition technology of the electric leakage detection according to the preferred embodiment of the present invention. The power supply system, for example, includes a motor (electric power load) 150 of a compressor 100, a power source 102 of three-phase alternate current supplying power to the motor 150, an electric circuit 104 transmitting power current from the power source 102, an electromagnetic contactor (opening and closing means) 106 switching conduction (closing)/non-conduction (opening) of the electric circuit 104, high pressure switch (operation abnormality detecting means) 108 detecting operation abnormality of the motor 150 (specifically, pressure abnormality), an electric leakage detection board (abnormal current detecting means) 110 detecting abnormal current (specifically, leakage current), and a control unit (controlling means) 112 controlling the electromagnetic contactor 106.

For example, a pressure sensor (measuring means) 128 measuring pressure inside the compressor and/or a discharge pipe thermometer (measuring means) measuring temperature of a discharge pipe (not shown) 132 are attached to the motor 150. These are sensors contributing to the judgment whether the cause of non-conduction of the electromagnetic contactor 106 is the electric leakage or not, in cooperation with a zero-phase-sequence current transformer 136, when the electromagnetic contactor 106 enters into the non-conduction state.

The electric leakage detection board 110 detects the abnormal current (zero-phase current) by the zero-phase-sequence current transformer 136 attached to the electric circuit 104, and transmits the detection result to the control unit 112. The detection result is also transmitted to a display unit 134. The display unit 134 displays the generation of the electric leakage by lighting LED and the like on the basis of the detection result of the abnormal current and the judgment result in the control unit 112 under the control of the electric leakage detection board 110. The judgment in the control unit 112 will be described later in details.

The control unit 112 includes a relay (relay means) 114 operating the electromagnetic contactor 106, and the first protection switch 116 and the second protection switch 118 connected in series between the power source 102 and the relay 114. The first protection switch 116 is a means normally provided from before, and enters into the non-conduction state when any operation abnormalities (except the electric leakage) are generated in an outdoor unit and a heat source unit (both not shown) so that the inner pressure of the motor 150 exceeds a pressure value P1 (see FIG. 2). The second protection switch enters into the non-conduction state when the leakage current is generated in the electric circuit 104. That is, power is not fed to the relay 114 not only when the operation abnormality is generated, but also when the leakage current is generated. Accordingly, the electromagnetic contactor 106 is in conduction state when power is fed to the relay 114, and is in non-conduction state when power is not fed to the relay 114.

The control unit 112 includes a storing unit (storing means) 120 and a timer (measuring means) 124. The storing unit 120 stores threshold values such as a time threshold value 122, a pressure threshold value 126, a temperature threshold value 130 and the like contributing to the judgment whether the leakage current is generated or not. The timer 124 measures time from starting the power feeding from the power source 102.

<Judgment Method of Electric Leakage Generation>

Figure 2:
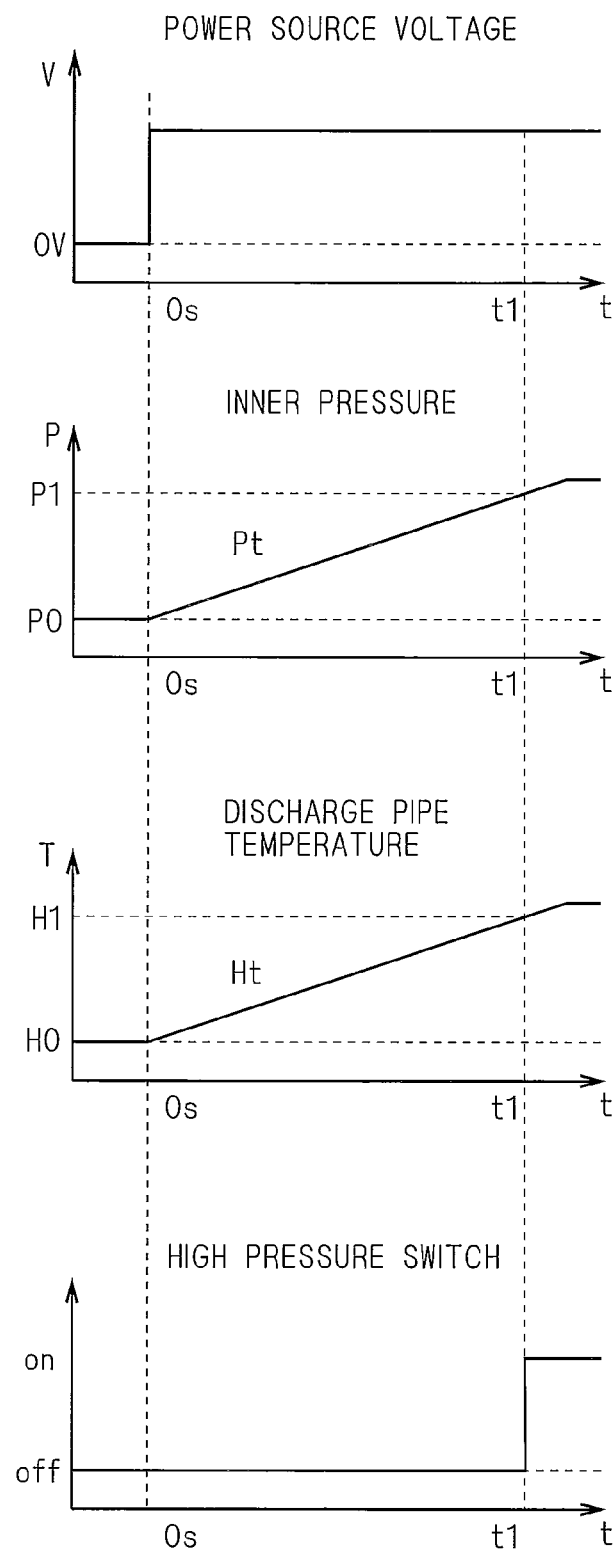
FIG. 2 is a view showing an operating state of a compressor.

FIG. 2 is a view showing an operating state of the compressor 100. In the compressor 100, an inner pressure P of the motor 150 gradually changes in accordance with the operating time from starting at the time of normal operation. A discharge pipe temperature T gradually changes along with this. This is because the current is consumed for an initial operation and for pressurizing inside the compressor 100 immediately after starting.

The high pressure switch 108 operates by operation abnormality when the inner pressure P exceeds the previously determined threshold value P1 (e.g., 4 Mpa), and a constant time t1 (e.g., 30 s) is required for the inner pressure P reaching the threshold value. The threshold value P1 and the time t1 are calculated in accordance with types of a selected refrigerant and performance of the motor 150.

Accordingly, when the time threshold value 122 stored in the storing unit 120 is set at the time t1 and the power feeding to the relay 114 is interrupted at the time of when the operating time is shorter than the time t1 (that is, the electromagnetic contactor 106 enters into the non-conduction state), it is judged that the second protection switch 118 enters into the non-conduction state, that is, the leakage current is generated.

Presence or absence of generation of the electric leakage is also judged by the following manner that the compressor 100 includes the pressure sensor 128 along with the timer 124 and the storing unit 120 stores the pressure threshold value 126. That is, as shown in FIG. 2, the inner pressure P changes as the operating time elapses at the time of normal operation. Therefore, when the pressure threshold value 126 stored in the storing unit 120 is set at a predetermined value in accordance with the operating time from starting (in FIG. 2, a pressure estimated value Pt depending on the operating time) and an inner pressure value measured by the pressure sensor 128 at the time of when the power feeding to the relay 114 is interrupted is lower than the pressure estimated value Pt, it is judged that the second protection switch 118 enters into the non-conduction state, that is, the leakage current is generated.

Alternatively, when it is difficult to place the pressure sensor 128, the compressor includes a discharge pipe thermometer 132 together with the timer 124 and the storing unit 120 stores the temperature threshold value 130 so as to judge the presence or absence of the generation of the electric leakage as follows. That is, as shown in FIG. 2, a discharge pipe temperature T changed along with the change of the inner pressure P. In other words, the inner pressure P is estimated by measuring the discharge pipe temperature T. Accordingly, when the temperature threshold value 130 stored in the storing unit 120 is set at a predetermined value in accordance with the operating time from starting (in FIG. 2, a temperature estimated value Ht depending on the operating time), and the discharge temperature measured by the discharge thermometer 132 is lower than the temperature estimated value Ht when the power feeding to the relay 114 is interrupted, it is judged that the second protection switch 118 enters into the non-conduction state, that is, the leakage current is generated.

Both of the pressure sensor 128 and the discharge thermometer 132 are not necessarily provided, but either one of them may be provided. The pressure threshold value 126 and the temperature threshold value 130 are not necessarily set at valued previously determined in accordance with the operating time from starting, they may be measured values measured by various measuring means or values calculated by a function on the basis of the values set by a user.

The configurations other than the electric leakage detection board 110, the second protection switch 118, the pressure sensor 128, the discharge pipe thermometer 132, the display unit 134, and the zero-phase-sequence current transformer 136, out of the above-described configurations, are means normally provided in the motor 150, so that the electric leakage detection function is allowed to be retrofitted with a simple work. If an example is given, the electric leakage detection board 110 including the display unit 134 is connected by subjecting a connector for a high pressure switch to harness processing so as to interpose the second protection switch 118 between the relay 114 and the first protection switch 116. Further, the pressure sensor 128 and/or the discharge pipe thermometer 132 are/is appropriately placed to connect their/its output to a controlling means.

Current flowing in the motor 150, specifically, current flowing in the electromagnetic contactor 106 is much larger than current flowing in the relay 114. Accordingly, for instance, when the second protection switch 118 is connected to the electromagnetic contactor 106 in series, it is necessary to interpose a withstanding pressure switch corresponding to great current flowing in the electromagnetic contactor 106, which is difficult. However, as described above, the current flowing in the relay 114 is much smaller than the current flowing in the electromagnetic contactor 106 so that a switch having a small power capacity is applied to the second protection switch 118, allowing an easy retrofitting.

<Operation>

FIG. 3 is a flow chart showing a recognition method of the electric leakage detection. The power supply system of the compressor 100 performs the following operation by including the above configuration. The present flow chart shows only a process regarding the electric leakage detection, omitting other processes to be shown and described. A series of the processes in the compressor 100 is automatically performed by the control unit 112, unless otherwise stated.

First, when the power source 102 is started by switching from OFF to ON, the electric leakage detection board 110 waits until the abnormal current is detected in the electric circuit 104 by the zero-phase-sequence current transformer 136 (steps S101, S102).

When the abnormal current is detected, yes is selected in the step S102 to interrupt the power feeding to the relay 114 (step S103). At the time of detecting the abnormal current, it is judged whether the operating time from starting is less than the time t1 or not, or whether the inner pressure value measure by the pressure sensor 128 is less than the pressure estimated value Pt or not, or whether the discharge pipe temperature measured by the discharge pipe thermometer 132 is lower than the temperature estimated value Ht or not (steps S104 to S106).

When Yes is selected in any of the above steps S104 to S106, it is judged that the power feeding to the relay 114 is interrupted by the non-conduction state of the second protection switch 118 due to the generation of the electric leakage, displaying the generation of the electric leakage on the display unit 134 (steps S107, S108). When No is selected in any of the above steps S104 to S106, it is judged that the power feeding to the relay 114 is interrupted since the inner pressure of the motor 150 exceeds the pressure value P1 due to the operation abnormality to operate the high pressure switch 108 (step S109).

<Effect>

As described above, when the abnormal current is detected, the operation abnormality of the motor 150 is assumed other than the electric leakage. Focusing on this point, the presence or absence or the electric leakage is judged on the basis of the presence or absence of the operation abnormality of the motor 150. In addition, the detecting means of the abnormal current is conducted by employing a means provided normally in the electric circuit 104. The judgment of the presence or absence of the operation abnormality is conducted by employing a means subjected normally to the motor 150. Accordingly, the generation of the electric leakage is recognized without newly providing means for detecting the abnormal current and judging the presence or absence of the operation abnormality.

The relay 114 and the first protection switch 116 are means normally provided from before so that they are accomplished only by connecting the second protection switch therebetween in series.

In the compressor 100, the current is normally consumed for the initial operation and for pressurizing inside the compressor 100 while the predetermined time t1 has passed from starting. Focusing on this point, the electric leakage is accurately recognized and dealt with immediately. The timer 124 measuring the operating time from starting may be mounted on the existing compressor so that it is accomplished without providing a new means.

The pressure sensor 128 measuring the inner pressure of the compressor 100 and the pressure threshold value 126 may be mounted on the existing compressor so that they are accomplished without providing new means.

The discharge pipe thermometer 132 measuring the discharge pipe temperature and the temperature threshold value 130 may be mounted on the existing compressor so that they are accomplished without providing new means.

It is displayed that the electric leakage is generated on the basis of the result detected by the electric leakage detection board 110 so that the operation of the electric leakage detection is clearly recognized.

<Variation>

While the preferred embodiment of the present invention has been described above, the present invention is not limited to the above-described embodiment. For instance, the display unit 134 may light LED not only when the electric leakage is generated but also when the abnormal current is not caused by the electric leakage. In this case, for example, the display may be performed with a different color from the display at the time of the generation of the electric leakage. This indicates that the electric leakage detection function operates without problems, dealing with the operation abnormality immediately.

While the invention has been shown and described in detail, the foregoing description is in all aspects illustrative and not restrictive. It is therefore understood that numerous modifications and variations can be devised without departing from the scope of the invention.

The invention claimed is:

1. An electric leakage detection method in a power supply system including:
    an electrical circuit;
    an opening and closing means switching conduction (opening)/non-conduction (closing) of said electrical circuit;
    an electric power load connected to said electrical circuit through said opening and closing means;
    an operation abnormality detecting means detecting operation abnormality of said electric power load;
    an abnormal current detecting means detecting abnormal current; and
    a controlling means controlling said opening and closing means,
    the electric leakage detection method comprising the steps of:
        (a) judging whether the abnormal current is detected or not in said electrical circuit;
        (b) judging whether said electric power load is operation abnormality or not when the judgment in said step (a) is positive;
        (c) judging that the electric leakage is generated in said electrical circuit when the judgment in said step (b) is negative; and
        (d) judging that the electric leakage is not generated in said electrical circuit when the judgment in said step (b) is positive.

2. The electric leakage detection method according to claim 1, wherein
    said power supply system further includes:
    a power source;
        a relay means operating said opening and closing means; and
        a first protection switch and a second protection switch connected in series between said power source and said relay means,
        said opening and closing means enters into a conducting state when power is supplied to said relay means,
        said opening and closing means enters into a non-conducting state when power is not supplied to said relay means,
    said first protection switch enters into a non-conducting state when the judgment in said step (b) is positive, and
    said second protection switch enters into a non-conducting state when the judgment in said step (b) is negative.

3. The electric leakage detection method according to claim 2, wherein
    said power supply system further includes:
    a storing means storing threshold values of items previously determined; and
    a measuring means measuring actual values of said items stored in said storing means, and
    in said step (b), said electric power load is judged whether it is operation abnormality or not by comparing said threshold values and said actual values.

4. The electric leakage detection method according to claim 3, wherein said power supply system is applied to a compressor, and in said step (b), said electric power load is judged whether it is operation abnormality or not by comparing inner pressure of said compressor calculated on the basis of said actual values measured by said measuring means and said threshold values stored in said storing means.

5. The electric leakage detection method according to claim 4, wherein
    said measuring mean measures operating time from starting of said compressor,
    said storing means stores a time threshold value previously determined, and
    in said step (b), when time while detecting said abnormal current is shorter than said time threshold value, the judgment is negative.

6. The electric leakage detection method according to claim 5, wherein
    said measuring means measures the inner pressure of said compressor, said storing means stores the pressure threshold value previously determined in accordance with the operating time from starting, and in said step (b), when said inner pressure at the time of detecting said abnormal current is lower than said pressure threshold value, the judgment is negative.

7. The electric leakage detection method according to claim 6, wherein said power supply system further includes a display means, and the electric leakage detection method further includes a step of (e) displaying the judgment results of said steps (c) and (d) on said display means.

8. The electric leakage detection method according to claim 5, wherein said measuring means measures temperature of a discharge pipe provided in said compressor, said storing means stores a temperature threshold value of the discharge pipe previously determined in accordance with the operating time from starting, and in said step (b), when said temperature at the time of detecting said abnormal current is lower than said temperature threshold value, the judgment is negative.

9. The electric leakage detection method according to claim 8, wherein said power supply system further includes a display means, and the electric leakage detection method further includes a step of (e) displaying the judgment results of said steps (c) and (d) on said display means.

10. The electric leakage detection method according to claim 5, wherein said power supply system further includes a display means, and the electric leakage detection method further includes a step of (e) displaying the judgment results of said steps (c) and (d) on said display means.

11. The electric leakage detection method according to claim 4, wherein said measuring means measures the inner pressure of said compressor, said storing means stores a pressure threshold value previously determined in accordance with the operating time from starting, and in said step (b), when said inner pressure at the time of detecting said abnormal current is lower than said pressure threshold value, the judgment is negative.

12. The electric leakage detection method according to claim 11, wherein said measuring means measures temperature of a discharge pipe provided in said compressor, said storing means stores a temperature threshold value of the discharge pipe previously determined in accordance with the operating time from starting, and in said step (b), when said temperature at the time of detecting said abnormal current is lower than said temperature threshold value, the judgment is negative.

13. The electric leakage detection method according to claim 12, wherein said power supply system further includes a display means, and the electric leakage detection method further includes a step of (e) displaying the judgment results of said steps (c) and (d) on said display means.

14. The electric leakage detection method according to claim 11, wherein said power supply system further includes a display means, and the electric leakage detection method further includes a step of (e) displaying the judgment results of said steps (c) and (d) on said display means.

15. The electric leakage detection method according to claim 4, wherein said measuring means measures temperature of a discharge pipe provided in said compressor, said storing means stores a temperature threshold value of the discharge pipe previously determined in accordance with the operating time from starting, and in said step (b), when said temperature at the time of detecting said abnormal current is lower than said temperature threshold value, the judgment is negative.

16. The electric leakage detection method according to claim 15, wherein said power supply system further includes a display means, and the electric leakage detection method further includes a step of (e) displaying the judgment results of said steps (c) and (d) on said display means.

17. The electric leakage detection method according to claim 4, wherein said power supply system further includes a display means, and the electric leakage detection method further includes a step of (e) displaying the judgment results of said steps (c) and (d) on said display means.

18. The electric leakage detection method according to claim 2, wherein said power supply system further includes a display means, and the electric leakage detection method further includes a step of (e) displaying the judgment results of said steps (c) and (d) on said display means.

19. The electric leakage detection method according to claim 3, wherein said power supply system further includes a display means, and the electric leakage detection method further includes a step of (e) displaying the judgment results of said steps (c) and (d) on said display means.

20. The electric leakage detection method according to claim 1, wherein said power supply system further includes a display means, and the electric leakage detection method further includes a step of (e) displaying the judgment results of said steps (c) and (d) on said display means.

* * * * *